United States Patent
Kwon

(10) Patent No.: US 10,050,199 B2
(45) Date of Patent: Aug. 14, 2018

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventor: Younggil Kwon, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/704,317

(22) Filed: Sep. 14, 2017

(65) Prior Publication Data

US 2018/0006226 A1    Jan. 4, 2018

Related U.S. Application Data

(63) Continuation of application No. 15/065,390, filed on Mar. 9, 2016, now Pat. No. 9,768,384.

(30) Foreign Application Priority Data

Jul. 22, 2015   (KR) .................. 10-2015-0103877

(51) Int. Cl.
*H01L 29/08*      (2006.01)
*H01L 51/00*      (2006.01)
(Continued)

(52) U.S. Cl.
CPC ...... *H01L 51/0007* (2013.01); *H01L 27/3202* (2013.01); *H01L 27/3209* (2013.01);
(Continued)

(58) Field of Classification Search
CPC .............. H01L 51/0007; H01L 51/504; H01L 27/3209; H01L 51/0005; H01L 51/0016;
(Continued)

(56) References Cited

U.S. PATENT DOCUMENTS

2005/0196969 A1   9/2005   Gunner et al.
2011/0159252 A1   6/2011   Ober et al.
(Continued)

FOREIGN PATENT DOCUMENTS

JP   2008-243817   10/2008
JP   2010-135097   6/2010
KR   10-2011-0009708   1/2011

OTHER PUBLICATIONS

Latini et al., "Superficial fluoropolymer layers for efficient light-emitting diodes", Organic Electronics, 2012, p. 992-998, vol. 13.
(Continued)

*Primary Examiner* — Thinh T Nguyen
(74) *Attorney, Agent, or Firm* — H.C. Park & Associates, PLC

(57) ABSTRACT

An organic light-emitting display apparatus, including: a first electrode disposed on the substrate; a pixel defining layer covering an edge of the first electrode; a residual layer disposed on the first electrode and the pixel defining layer, the residual layer comprising a fluoropolymer; a first organic functional layer comprising a first light emitting layer disposed on the residual layer on the first electrode; and a second electrode disposed on the first organic functional layer.

10 Claims, 36 Drawing Sheets

(51) Int. Cl.
  *H01L 27/32* (2006.01)
  *H01L 51/52* (2006.01)
  *H01L 51/56* (2006.01)
  *H01L 51/50* (2006.01)

(52) U.S. Cl.
  CPC ...... *H01L 51/0005* (2013.01); *H01L 51/0016* (2013.01); *H01L 51/0018* (2013.01); *H01L 51/504* (2013.01); *H01L 51/5228* (2013.01); *H01L 51/56* (2013.01); *H01L 27/3246* (2013.01); *H01L 51/5253* (2013.01); *H01L 51/5256* (2013.01); *H01L 2251/5315* (2013.01)

(58) Field of Classification Search
  CPC . H01L 51/56; H01L 51/5228; H01L 27/3202; H01L 51/0018; H01L 51/5253
  USPC .... 257/40, 59, 72, 642, E51.02; 438/82, 26, 438/29, 99
  See application file for complete search history.

(56) References Cited

U.S. PATENT DOCUMENTS

| | | | |
|---|---|---|---|
| 2012/0274807 A1* | 11/2012 | Shiobara | H01L 51/0018 348/231.99 |
| 2013/0210176 A1 | 8/2013 | Fushimi et al. | |
| 2013/0236999 A1 | 9/2013 | Lee et al. | |
| 2014/0127625 A1 | 5/2014 | Defranco et al. | |
| 2014/0248565 A1 | 9/2014 | Defranco et al. | |

OTHER PUBLICATIONS

Gao et al., "Bright single-active layer small-molecular organic light-emitting diodes with a polytetrafluoroethylene barrier", Applied Physics Letters, Jan. 13, 2003, p. 155-157, vol. 82, No. 2.
Kang et al., "Fluoropolymer indium-tin-oxide buffer layers for improved power conversion in organic photovoltaics", Applied Physics Letters, 2003, p. 93-95, vol. 93.
Notice of Allowance dated May 19, 2017, in U.S. Appl. No. 15/065,390.

* cited by examiner

ORGANIC LIGHT-EMITTING DISPLAY APPARATUS AND METHOD OF MANUFACTURING THE SAME

CROSS-REFERENCE TO RELATED APPLICATION

This application is a Continuation of U.S. patent application Ser. No. 15/065,390, filed on Mar. 9, 2016, and claims priority from and the benefit of Korean Patent Application No. 10-2015-0103877, filed on Jul. 22, 2015, which is hereby incorporated by reference for all purposes as if fully set forth herein.

BACKGROUND

Field

Exemplary embodiments relate to an organic light-emitting display apparatus and a method of manufacturing the same.

Discussion of the Background

An organic light-emitting display apparatus is a self-luminous display apparatus having a hole injection electrode, an electron injection electrode, and an organic light-emitting layer between the hole injection electrode and the electron injection electrode. As holes injected by the hole injection electrode and electrons injected by the electron injection electrode are combined and become neutral in the organic light-emitting layer, light is emitted. The organic light-emitting display apparatus has been highlighted as a next generation display apparatus having high quality characteristics, for example, low power consumption, high brightness, and fast response speed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method of manufacturing an organic light-emitting display apparatus, whereby a pattern misalignment may be prevented, a process may be simplified, efficiency may be increased, and a lifespan may be extended, and an organic light-emitting display apparatus manufactured by the above method.

Additional aspects of the invention will be set forth in the description which follows, and, in part, will be apparent from the description, or may be learned by practice of the inventive concept.

An exemplary embodiment of the present invention discloses a method of manufacturing an organic light-emitting display apparatus, including: forming a liftoff layer containing a fluoropolymer on a substrate; forming a photoresist on the liftoff layer and patterning the photoresist by removing a portion thereof; etching, using a first solvent, the liftoff layer in a region where the photoresist is removed so that a portion of the liftoff layer remains on the substrate; forming an etch stop layer above the liftoff layer that remains on the substrate and above a region where the photoresist remains on the liftoff layer; and removing, using a second solvent, the liftoff layer under the region where the photoresist remains on the liftoff layer.

An exemplary embodiment of the present invention also discloses a method of manufacturing an organic light-emitting display apparatus, including: forming a plurality of first electrodes on a substrate and performing a first unit process, the first unit process including: forming a liftoff layer containing a fluoropolymer on the substrate on which the plurality of first electrodes are formed; forming a photoresist on the liftoff layer, and removing the photoresist at a position corresponding to one of the plurality of first electrodes by a photolithography process; etching the liftoff layer using a first solvent including fluorine so that a portion of the liftoff layer remains on the one of the plurality of first electrodes; forming a first organic functional layer including a light-emitting layer above the liftoff layer that remains on the one of the plurality of first electrodes and above a region where the photoresist remains on the liftoff layer; and removing, using a second solvent including fluorine, the liftoff layer formed in the region where the photoresist remains on the liftoff layer. The method further includes, after performing the first unit process: performing at least one time a second unit process of forming, in a region where another of the plurality of first electrodes different from the one of the plurality of first electrodes is formed, an organic functional layer emitting light of a color different from the color of light emitted by the first organic functional layer; and, after performing the first and second unit processes, forming a second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description serve to explain the principles of the inventive concept.

DETAILED DESCRIPTION OF THE ILLUSTRATED EMBODIMENTS

Figure 1:
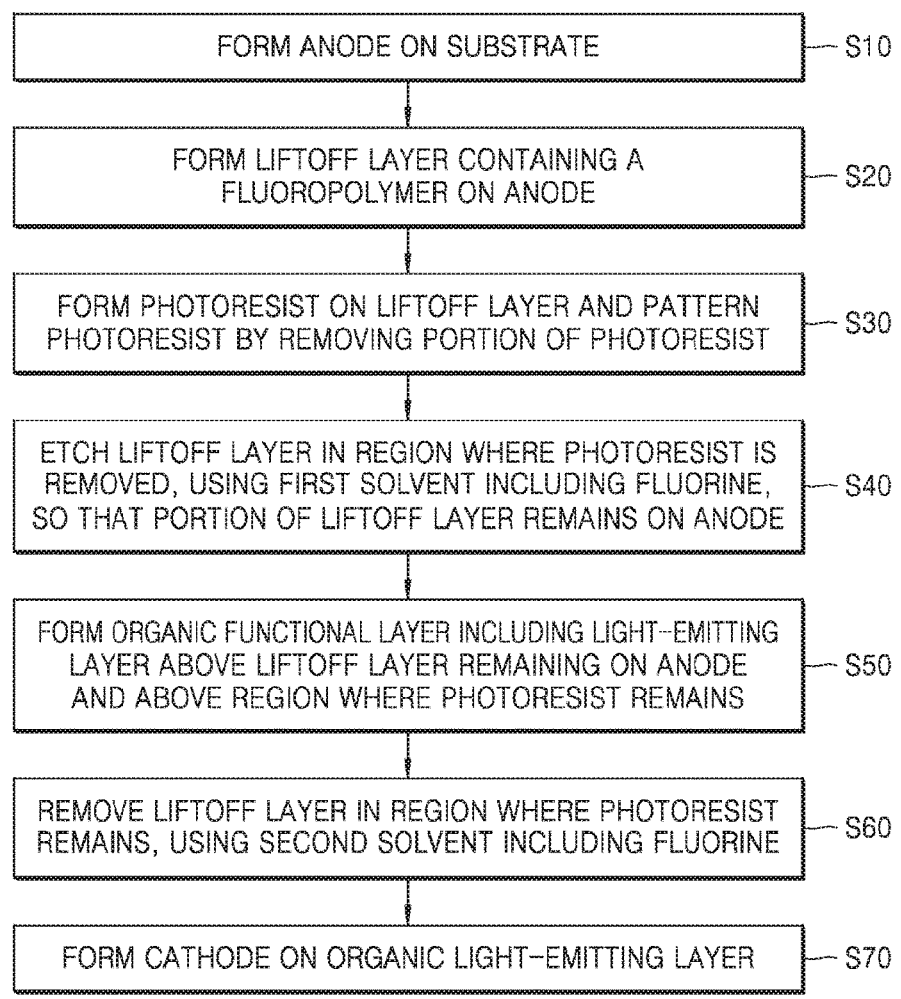
FIG. 1 is a flowchart of a manufacturing method according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a flowchart of a manufacturing method according to an exemplary embodiment.

Referring to FIG. 1, in the method of manufacturing an organic light-emitting display apparatus according to an exemplary embodiment, an anode is formed on a substrate in step S10; a liftoff layer containing a fluoropolymer is formed on the anode in step S20; a photoresist is formed on the liftoff layer and patterned by removing a portion of the photoresist in step S30; the liftoff layer is etched in a region where the photoresist is removed using a first solvent including fluorine so that a portion of the liftoff layer remains on the anode in step S40, an organic functional layer, including a light-emitting layer, is formed above the liftoff layer remaining on the anode and above the region where the photoresist remains in step S50; and the liftoff layer formed in the region where the photoresist remains is removed using a second solvent including fluorine in step S60. The manufacturing method may further include an operation of forming a cathode on the organic light-emitting layer in step S70.

A method of manufacturing an organic light-emitting display apparatus and an organic light-emitting display apparatus manufactured by the manufacturing method according to exemplary embodiments are described in detail with reference to FIGS. 2 to 6F.

Figure 2:
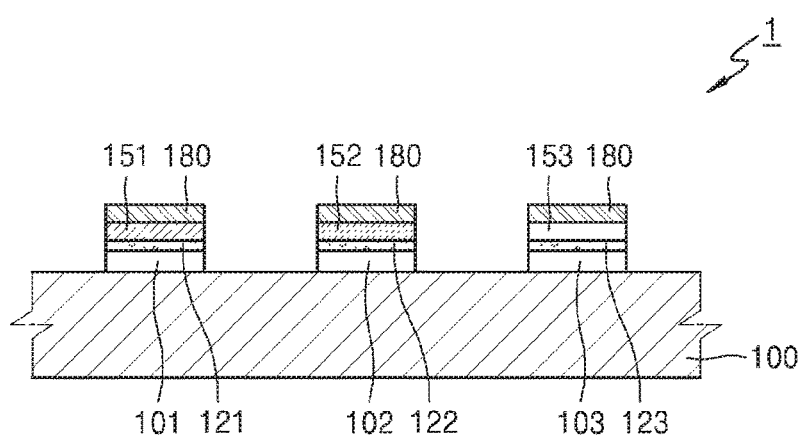
FIG. 2 is a schematic is a cross-sectional view showing an organic light-emitting display apparatus manufactured by a manufacturing method according to an exemplary embodiment of the present invention.
Figure 3:
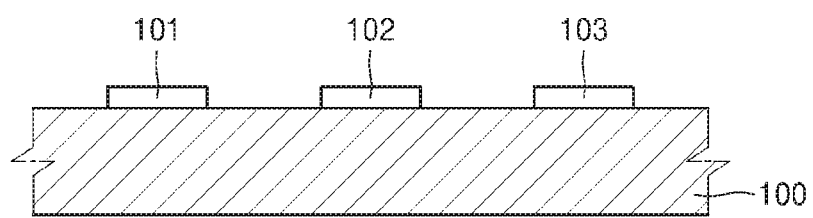
FIG. 3 is a cross-sectional view schematically showing an operation of forming a plurality of anodes on a substrate in the manufacturing method of FIG. 2.

FIG. 2 is a schematic cross-sectional view of an organic light-emitting display apparatus 1 manufactured by a manufacturing method according to an exemplary embodiment. FIG. 3 is a cross-sectional view schematically illustrating an operation of forming a plurality of anodes on a substrate by the manufacturing method of FIG. 2. FIGS. 4A to 4F are cross-sectional views schematically illustrating a first unit operation by the manufacturing method of FIG. 2. FIGS. 5A to 5F are cross-sectional views schematically illustrating a second unit operation by the manufacturing method of FIG. 2. FIGS. 6A to 6F are cross-sectional views schematically illustrating a third unit operation by the manufacturing method of FIG. 2.

Referring to FIG. 2, the organic light-emitting display apparatus 1 manufactured by a method according to an exemplary embodiment may include a plurality of anodes including a first anode 101, a second anode 102, and a third anode 103 on a substrate 100. First to third residual layers 121, 122, and 123 of a liftoff layer 120 of FIG. 4A containing a fluoropolymer are disposed on the first to third anodes 101, 102, and 103. First to third organic functional layers 151, 152, and 153 are disposed on the first to third residual layers 121, 122, and 123 of the liftoff layer. A cathode 180 is provided on each of the first to third organic functional layers 151, 152, and 153.

The first to third residual layers 121, 122, and 123 of the liftoff layer 120 containing a fluoropolymer may control surface energy of the first to third anodes 101, 102, and 103, and reinforce external quantum efficiency of the organic light-emitting display apparatus 1, which is described below.

Referring to FIG. 3, a plurality of anodes, including the first anode 101, the second anode 102, and the third anode 103, are formed on the substrate 100.

The substrate 100 may be formed of various materials. For example, the substrate 100 may be formed of glass or plastic. The plastic may be formed of a material having excellent thermal resistance and durability characteristics, such as, polyimide, polyethylenenaphthalate, polyethyleneterephthalate, polyarylate, polycarbonate, polyetherlmide, or polyethersulfone.

Although not illustrated in FIG. 3, a planar surface is formed above the substrate 100 and a buffer layer (not shown) may be further formed on the planar surface to prevent intrusion of impurity elements. The buffer layer may be formed of silicon nitride and/or silicon oxide in a single layer or in multiple layers.

The first to third anodes 101, 102, and 103, as hole injection electrodes, may be formed of a material having a relatively large work function. The first to third anodes 101, 102, and 103 may contain at least one selected from a group consisting of indium tin oxide, indium zinc oxide, zinc oxide, indium oxide, indium gallium oxide, and aluminum zinc oxide.

Although not illustrated in FIG. 3, the first to third anodes 101, 102, and 103 may be electrically connected to first to third thin film transistors (not shown) located between the substrate 100 and the first to third anodes 101, 102, and 103.

Figure 4A:
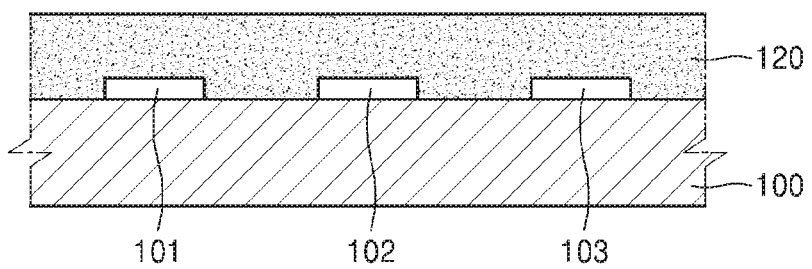
FIG. 4A, FIG. 4B, FIG. 4C, FIG. 4D, FIG. 4E, and FIG. 4F are cross-sectional views schematically showing a first unit operation of the manufacturing method of FIG. 2.

Referring to FIG. 4A, a liftoff layer 120 containing a fluoropolymer is formed on the substrate 100 over the first to third anodes 101, 102, and 103.

The fluoropolymer contained in the liftoff layer 120 may be a polymer having a 20~60 wt % fluorine content. For example, the fluoropolymer contained in the liftoff layer 120 may contain at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The liftoff layer 120 may be formed on the substrate 100 by a coating method, a printing method, or a deposition method. When the liftoff layer 120 is formed by a coating method or a printing method, a patterning process may be performed after performing a curing and polymerization process, as necessary.

The thickness of the liftoff layer 120 may be equal to or greater than about 0.2 µm and equal to or less than about 5 µm. When the liftoff layer 120 becomes undesirably thick, the time it takes to melt the liftoff layer 120 for patterning increases so that a manufacturing process time may be extended. When the liftoff layer 120 is undesirably thin, the liftoff layer 120 becomes difficult to lift off.

Figure 4B:
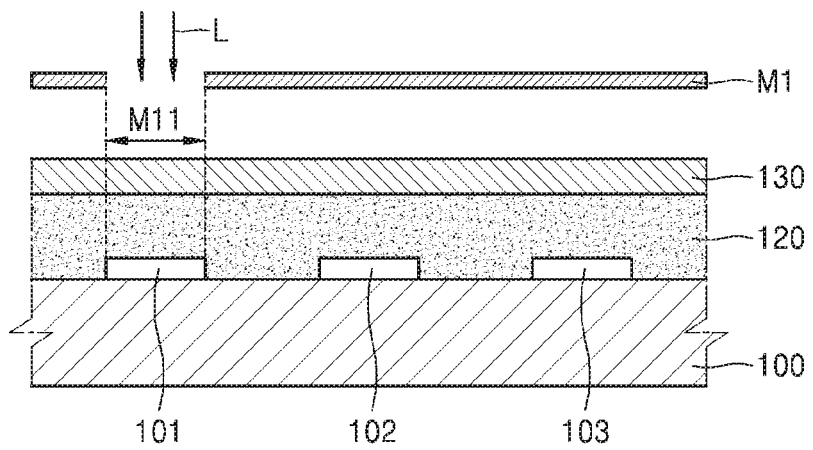

Referring to FIG. 4B, a photoresist 130 is formed on the liftoff layer 120. The photoresist 130 is exposed to light L at a position corresponding to the first anode 101 through a first photomask M1, including a first region M11 through which the light L is transmitted. Next, the photoresist 130 that is exposed is developed.

Figure 4C:
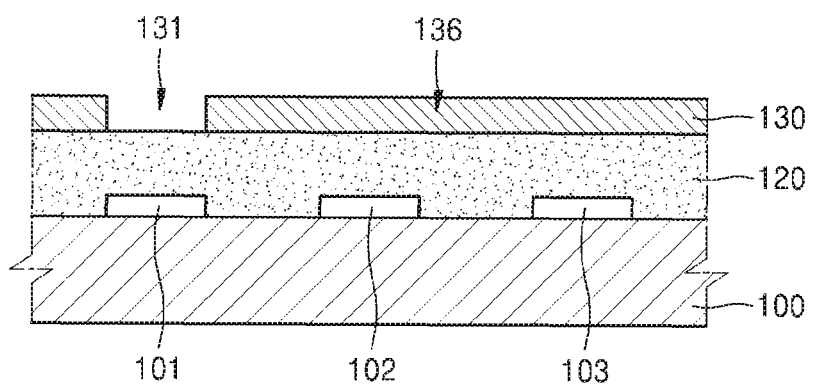

Referring to FIG. 4C, the photoresist 130 has a patterned shape. A first region 131 that is a position corresponding to the first anode 101 is removed from the photoresist 130 that is exposed and developed, and region 136 remains.

Although in FIG. 4C a positive-type photoresist 130 is described as an example, a negative-type photoresist may be used. In this case, to obtain a desired pattern, a pattern of the first photomask M1 may be designed to be different from the pattern of FIG. 3B.

Figure 4D:
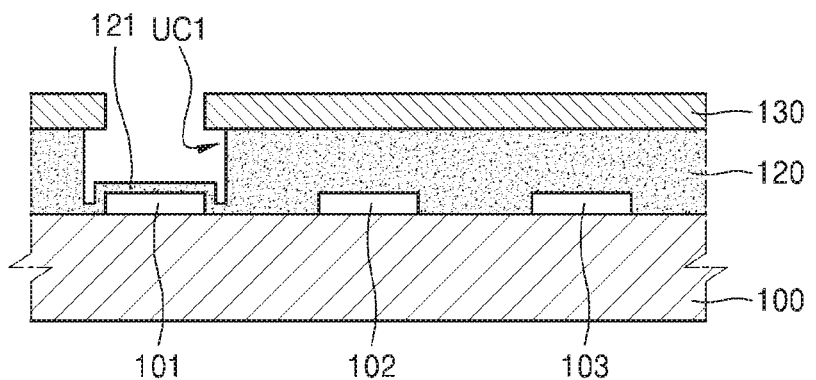

Referring to FIG. 4D, the liftoff layer 120 is etched using the pattern of the photoresist 130 of FIG. 4C.

Because the liftoff layer 120 contains a fluoropolymer, a solvent capable of etching the fluoropolymer may be used as an etchant.

A first solvent (not shown) containing fluorine may be used as an etchant.

The first solvent may contain hydrofluoroether. The hydrofluoroether is an electrochemically stable material as a result of its low interaction with other materials, and is an environmentally stable material as a result of its low global warming potential and toxicity.

In an etching process, the liftoff layer 120 formed at a position corresponding to the first region 131 (see FIG. 4C) of the photoresist 130, that is, above the first anode 101, is etched. In this state, the liftoff layer 120 above the first anode 101 is not entirely etched, but is etched such that a portion of the liftoff layer 120 remains on the first anode 101, thereby forming the first residual layer 121 of the liftoff layer 120.

The first residual layer 121 of the liftoff layer 120 containing the fluoropolymer is formed between the first anode 101 and the first organic functional layer 151 (see FIG. 2) to function as a surface energy adjustment layer. The first residual layer 121 of the liftoff layer 120 may adjust a charge balance of a device and prevent electrochemical interaction between heterogeneous layers, thereby improving the lifespan and efficiency of the device, which is described below.

The thickness of the first residual layer 121 of the liftoff layer 120 remaining on the first anode 101 may be equal to or greater than about 0.5 nm and equal to or less than about 5 nm. Because the first residual layer 121 of the liftoff layer 120 is an insulation layer containing a fluoropolymer, if the first residual layer 121 is undesirably thick, resistance increases so that the first residual layer 121 may be difficult to be used for a light-emitting device. If the first residual layer 121 is undesirably thin, the first residual layer 121 may be difficult to function as the surface energy adjustment layer.

The thickness of the first residual layer 121 of the liftoff layer 120 may be adjusted in order to maintain constant device characteristics.

The first residual layer 121 of the liftoff layer 120 may be formed by etching the liftoff layer 120 using the first solvent containing hydrofluoroether, and then performing a drying process by selectively adjusting a rinsing process. For example, the first residual layer 121 of the liftoff layer 120 may be formed by allowing the liftoff layer 120 to contain polytetrafluoroethylene and performing the etching process using 3M Novec Series 7100~7300 as the first solvent, and then a drying process without a rinsing process. Alternatively, when the rinsing process is performed using 3M Novec Series 7500, the thickness of a residual layer may be reduced.

When the liftoff layer 120 is etched using the first solvent containing hydrofluoroether and then dried by a spinning method, the first residual layer 121 of the liftoff layer 120 may be formed. In this connection, the thickness of a residual layer may be adjusted by adjusting spin RPM, time, or an acceleration force.

After the liftoff layer 120 is etched using the first solvent containing hydrofluoroether, the first residual layer 121 of the liftoff layer 120 may be formed by performing dry etching using oxygen plasma. In this state, the thickness of a residual layer may be adjusted by adjusting a ratio between a nitrogen gas and an oxygen gas, plasma power, or time.

Figure 10:
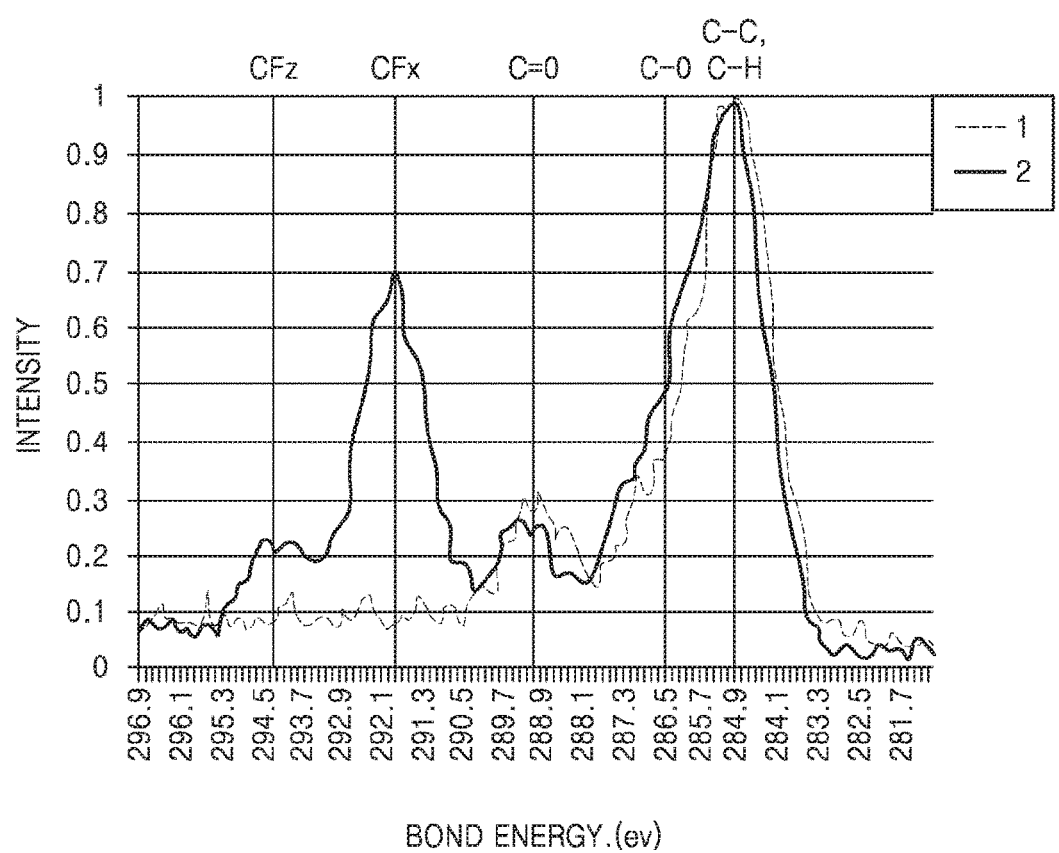
FIG. 10 is a graph of an XPS analysis showing that a residual layer of a liftoff layer is formed on an anode.

FIG. 10 is a graph of an X-ray photoelectron spectroscopy (XPS) analysis showing that a residual layer of a liftoff layer is formed on an anode. In the graph, the horizontal axis indicates bond energy, and the vertical axis indicates intensity of the bond energy.

Referring to FIG. 10, a first sample 1 denotes a case in which the entire liftoff layer on an anode is removed, and a second sample 2 denotes a case in which a residual layer of a liftoff layer is formed on an anode according to the present exemplary embodiment. It may be seen that the second sample 2 contains CFz and CFx included in a fluorinated copolymer, where $1 \leq x \leq 3$, $1 \leq z \leq 3$, and x and z are integers.

Alternatively, during the etching of the liftoff layer 120, the first solvent containing fluorine forms a first undercut profile UC1 in the liftoff layer 120 under an interface of the first region 131 (see FIG. 4C) of the photoresist 130.

The first undercut profile UC1 may enable forming a delicate deposition pattern of a first organic light-emitting layer in a deposition process (see FIG. 4E), which is described below, and may clearly remove the liftoff layer 120 remaining on the substrate 100 in a liftoff process (see FIG. 4F), which is described below.

Figure 4E:
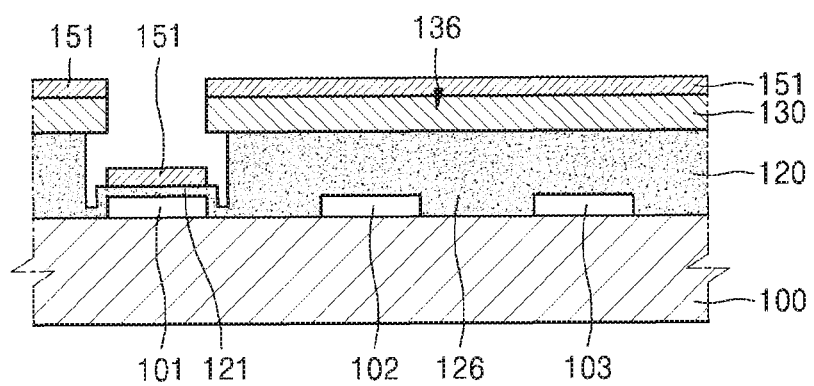

Referring to FIG. 4E, the first organic functional layer 151, including the first organic light-emitting layer, is formed on the structure of FIG. 4D.

The first organic functional layer 151 may further include at least one functional layer of a hole injection layer, a hole transport layer, an electron injection layer, and an electron injection layer.

In the present exemplary embodiment, the first organic light-emitting layer is used as an example of the first organic functional layer 151. Therefore, in the following description, the first organic functional layer and the first organic light-emitting layer will be referred to by the same reference numeral.

The first organic light-emitting layer 151 may be formed by a vacuum deposition method. In a deposition process, the liftoff layer 120 and the photoresist 130 function as masks. A portion of the first organic light-emitting layer 151 is formed on the first residual layer 121 of the liftoff layer 120. The other portion of the first organic light-emitting layer 151 is formed on the region 136 where the photoresist 130 remains.

Figure 4F:
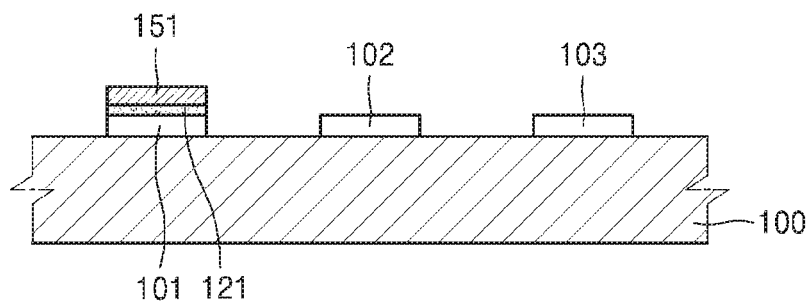

Referring to FIG. 4F, a liftoff process is performed on the structure of FIG. 4E.

Because the liftoff layer 120 contains a fluoropolymer, a second solvent containing fluorine is used in the liftoff process. Also, because the liftoff process is performed after the first organic light-emitting layer 151 is formed, a material having a low reactivity to the first organic light-emitting layer 151 may be used as the second solvent. The second solvent may contain hydrofluoroether, as in the first solvent.

As a liftoff layer 126 formed under the region 136 of FIG. 4E where the photoresist 130 remains is lifted off, the first organic light-emitting layer 151 formed on the region 136 where the photoresist 130 remains is removed, and the first organic light-emitting layer 151 formed on the first residual layer 121 of the liftoff layer 120 is left as a pattern. The first organic light-emitting layer 151 functions as an etch stopper with respect to the first residual layer 121 of the liftoff layer 120.

According to a result of the liftoff process, the first residual layer 121 of the liftoff layer 120 is formed between the first anode 101 and the first organic light-emitting layer 151.

The first residual layer 121 of the liftoff layer 120 containing a fluoropolymer may be formed between the first anode 101 and the first organic light-emitting layer 151 to control surface energy. As the first residual layer 121 of the liftoff layer 120 containing a fluoropolymer forms interfacial dipoles at an interface between the heterogeneous layers such, as the first anode 101 and the first organic light-emitting layer 151, an effective work function of the first anode 101 is increased and electrons are confined. Thus, a charge balance is increased so that external quantum efficiency of an organic light-emitting device may be improved.

As the first residual layer 121 of the liftoff layer 120 containing a fluoropolymer having a low reactivity functions as a zipper to reduce electrochemical interaction between the first anode 101 and the first organic light-emitting layer 151, that is, the two heterogeneous layers, the lifespan of the organic light-emitting device may be increased.

According to the present exemplary embodiment, the first residual layer 121 of the liftoff layer 120 containing a fluoropolymer formed between the first anode 101 and the first organic light-emitting layer 151, which controls surface energy of an organic light-emitting device and functions as an electrochemical zipper, may be formed in a first unit process of forming a pattern of the first organic light-emitting layer 151, and not by additional thermal deposition or a costly plasma process.

According to the present exemplary embodiment, because the pattern of the first organic light-emitting layer 151 is formed in the liftoff process, and not by being deposited using a metal mask (not shown) having an opening, any possible misalignment between the substrate 100 and the metal mask may be prevented.

A second unit process of forming the second organic light-emitting layer 152 (see FIG. 5F) for emitting light of a different color from the first organic light-emitting layer 151, in a region where the second anode 102 is located, is performed after performing the above-described first unit process. The second unit process is described below with reference to FIGS. 5A to 5F.

Figure 5A:
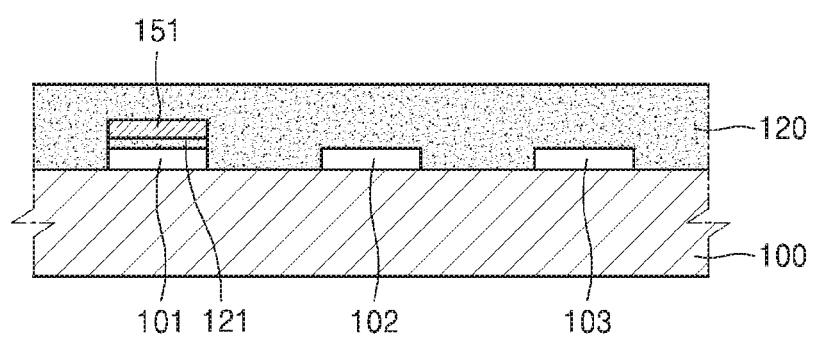
FIG. 5A, FIG. 5B, FIG. 5C, FIG. 5D, FIG. 5E, and FIG. 5F are cross-sectional views schematically showing a second unit operation of the manufacturing method of FIG. 2.

Referring to FIG. 5A, the liftoff layer 120 containing a fluoropolymer is formed on the substrate 100 where the first to third anodes 101, 102, and 103 are formed.

The liftoff layer 120 may include a material that is the same as or different from the fluoropolymer used in the first unit process. The liftoff layer 120 may be formed on the substrate 100 by a coating method, a printing method, or a deposition method.

Figure 5B:
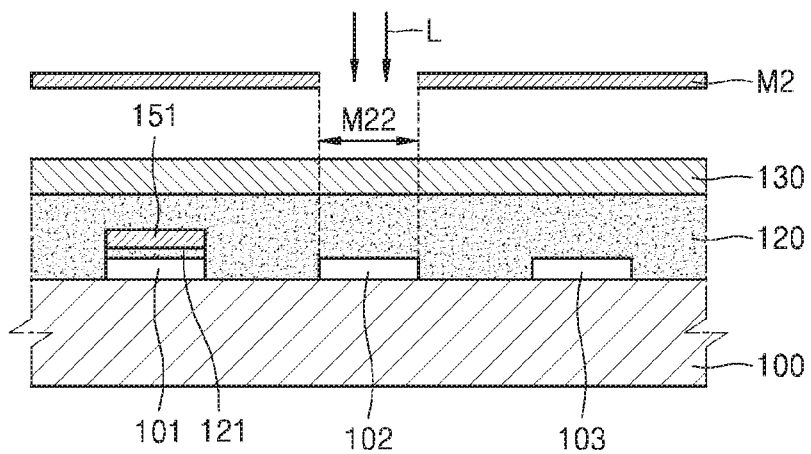

Referring to FIG. 5B, the photoresist 130 is formed on the liftoff layer 120. The photoresist 130 is exposed to light L at a position corresponding to the second anode 102 through a second photomask M2, including a second region M22 through which the light L is transmitted. Next, the photoresist 130 that is exposed is developed.

Figure 5C:
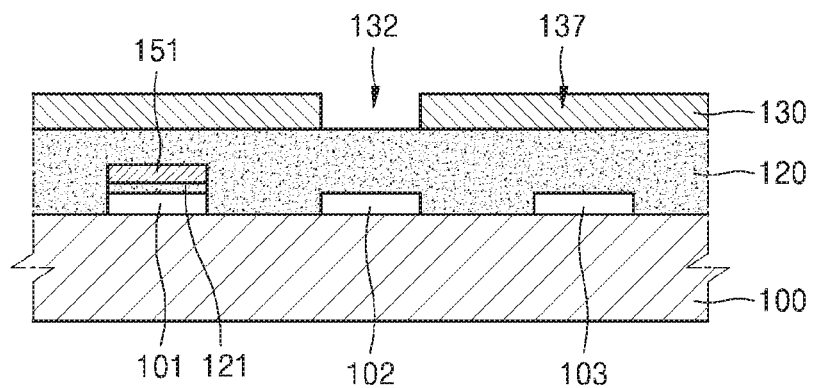

Referring to FIG. 5C, the photoresist 130 has a patterned shape. A second region 132 that is a position corresponding to the second anode 102 is removed from the photoresist 130 that is exposed and developed, and a region 137 remains.

Figure 5D:
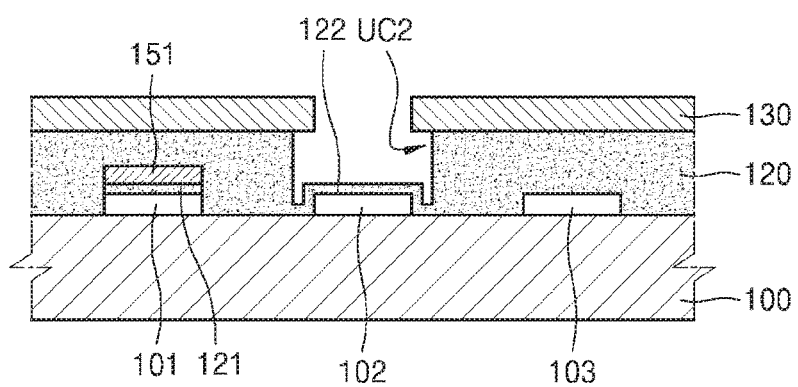

Referring to FIG. 5D, the liftoff layer 120 is etched using a pattern of the photoresist 130 of FIG. 5C.

Because the liftoff layer 120 contains a fluoropolymer, a solvent capable of etching a fluoropolymer may be used as an etchant. A first solvent (not shown) containing fluorine may be used as the etchant. The first solvent may contain hydrofluoroether, as in the above-described first unit process. The first solvent may use a material different from that used in the first unit process.

The liftoff layer 120 formed at a position corresponding to the second region 132 (see FIG. 5C) of the photoresist 130, that is, above the second anode 102, is etched by the etching process. The liftoff layer 120 on the second anode 102 is not entirely etched, but is etched to an extent such that a portion of the liftoff layer 120 remains on the second anode 102, thereby forming the second residual layer 122 of the liftoff layer 120.

The second residual layer 122 of the liftoff layer 120 containing a fluoropolymer is formed between the second anode 102 and the second organic functional layer 152 (see FIG. 5E), which is described below, to function as a surface energy adjustment layer. The second residual layer 122 of the liftoff layer 120 may adjust a charge balance of a device and prevent electrochemical interaction between heterogeneous layers, thereby improving the lifespan and efficiency of the device.

The thickness of the second residual layer 122 of the liftoff layer 120 remaining on the second anode 102 may be equal to or greater than about 0.5 nm and equal to or less than about 5 nm. Because the second residual layer 122 of the liftoff layer 120 is an insulation layer containing a fluoropolymer, if the second residual layer 122 is undesirably thick, resistance increases so that the second residual layer 122 may be difficult to be used for a light-emitting device. If the second residual layer 122 is undesirably thin, the second residual layer 122 may be difficult to function as the surface energy adjustment layer.

The thickness of the second residual layer 122 of the liftoff layer 120 may be adjusted in order to maintain constant device characteristics. Because a method of adjusting a thickness may be performed in the same method as in the first unit process, a detailed description thereof is omitted.

During the etching of the liftoff layer 120, the first solvent containing fluorine forms a second undercut profile UC2 in the liftoff layer 120 under an interface of the second region 132 (see FIG. 5D) of the photoresist 130.

Figure 5E:
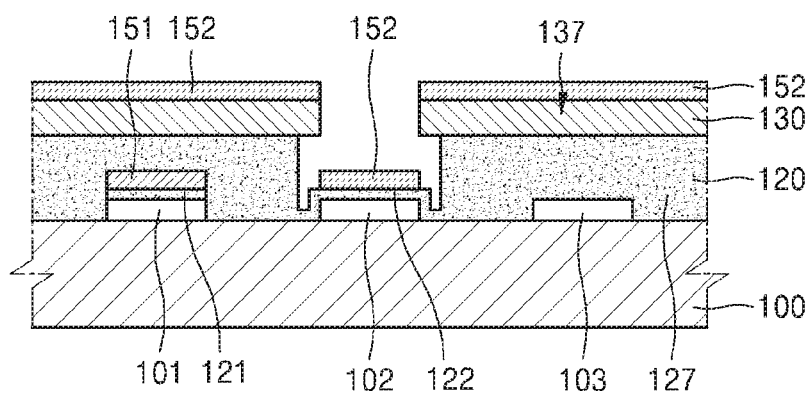

Referring to FIG. 5E, the second organic functional layer 152 including a second organic light-emitting layer is formed on the structure of FIG. 5D.

The second organic functional layer 152 may further include at least one functional layer of a hole injection layer, a hole transport layer, an electron injection layer, and an electron injection layer.

In the present exemplary embodiment, the second organic light-emitting layer is used as an example of the second organic functional layer 152. Thus, in the following description, the second organic functional layer and the second organic light-emitting layer may have the same reference numeral.

The second organic light-emitting layer 152 may be formed by a vacuum deposition method. In a deposition process, the liftoff layer 120 and the photoresist 130 function as masks. A portion of the second organic light-emitting layer 152 is formed on the second residual layer 122 of the liftoff layer 120. The other portion of the second organic light-emitting layer 152 is formed on the region 137 where the photoresist 130 remains.

Figure 5F:
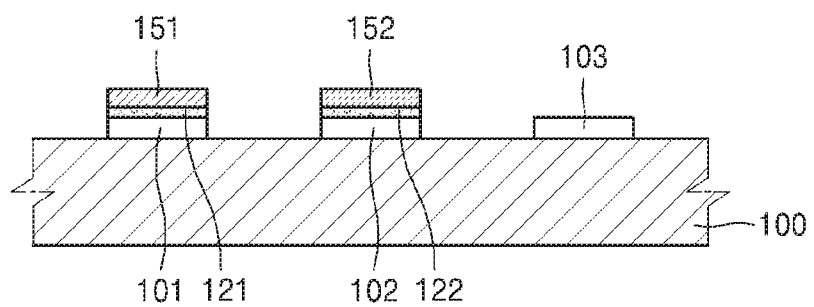

Referring to FIG. 5F, a liftoff process is performed on the structure of FIG. 5E.

Because the liftoff layer 120 contains a fluoropolymer, a second solvent containing fluorine is used in the liftoff process. Also, because the liftoff process is performed after the second organic light-emitting layer 152 is formed, a material having a low reactivity to the second organic light-emitting layer 152 may be used as the second solvent. The second solvent may contain hydrofluoroether, as in the first solvent.

As a liftoff layer 127 formed under the region 137 of FIG. 5E where the photoresist 130 remains is lifted off, the second organic light-emitting layer 152 formed on the region 137 where the photoresist 130 remains is removed, and the second organic light-emitting layer 152 formed on the second residual layer 122 of the liftoff layer 120 is left as a pattern. The second organic light-emitting layer 152 functions as an etch stopper with respect to the second residual layer 122 of the liftoff layer 120.

According to a result of the liftoff process of the second unit process, the second residual layer 122 of the liftoff layer 120 is formed between the second anode 102 and the second organic light-emitting layer 152.

The second residual layer 122 of the liftoff layer 120 containing a fluoropolymer may be formed between the second anode 102 and the second organic light-emitting layer 152 to control surface energy. As the second residual layer 122 of the liftoff layer 120 containing a fluoropolymer forms interfacial dipoles at an interface between the heterogeneous layers such as the second anode 102 and the second organic light-emitting layer 152, an effective work function of the second anode 102 is increased and electrons are confined. Thus, a charge balance is increased so that external quantum efficiency of an organic light-emitting device may be improved.

As the second residual layer 122 of the liftoff layer 120 containing a fluoropolymer having a low reactivity functions as a zipper to reduce electrochemical interaction between the second anode 102 and the second organic light-emitting layer 152, that is, the two heterogeneous layers, the lifespan of the organic light-emitting device may be increased.

A third unit process of forming the third organic light-emitting layer 153 (see FIG. 6F) for emitting light of a different color from the first organic light-emitting layer 151 and the second organic light-emitting layer 152, in a region where the third anode 103 is located, is performed after performing the above-described second unit process. The third unit process is described below with reference to FIGS. 6A to 6F.

Figure 6A:
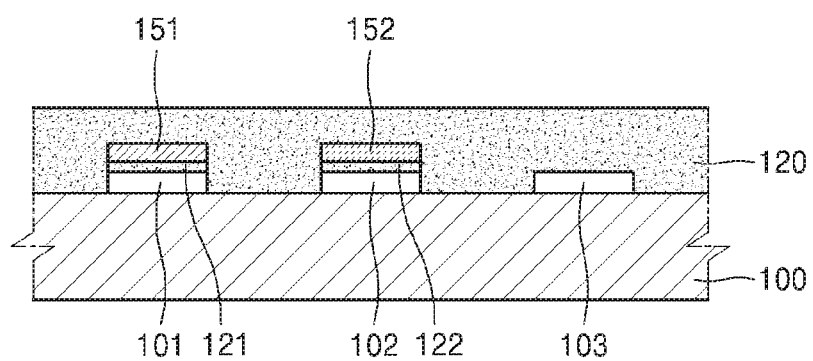
FIG. 6A, FIG. 6B, FIG. 6C, FIG. 6D, FIG. 6E, and FIG. 6F are cross-sectional views schematically showing a third unit operation of the manufacturing method of FIG. 2.

Referring to FIG. 6A, the liftoff layer 120 containing a fluoropolymer is formed on the substrate 100 where the first to third anodes 101, 102, and 103 are formed.

The liftoff layer 120 may include a material that is the same as or different from the fluoropolymer used in the first unit process and the second unit process. The liftoff layer 120 may be formed on the substrate 100 by a coating method, a printing method, or a deposition method.

Figure 6B:
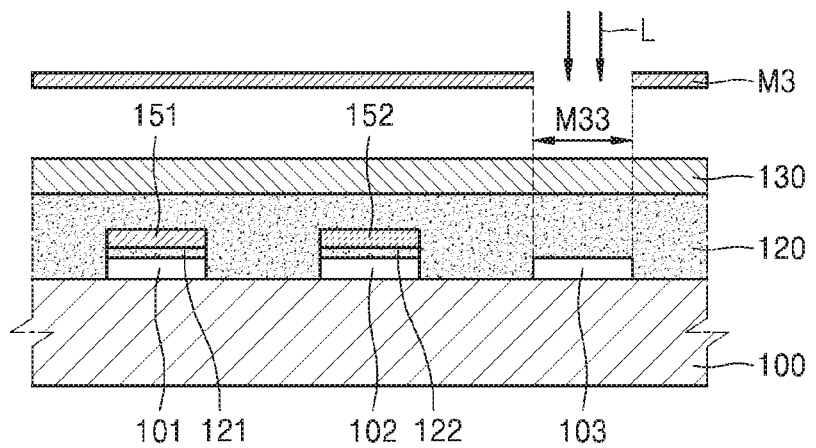

Referring to FIG. 6B, the photoresist 130 is formed on the liftoff layer 120. The photoresist 130 at a position corresponding to the third anode 103 is exposed to light L through a third photomask M3 including a third region M33 through which the light L is transmitted. Next, the photoresist 130 that is exposed is developed.

Figure 6C:
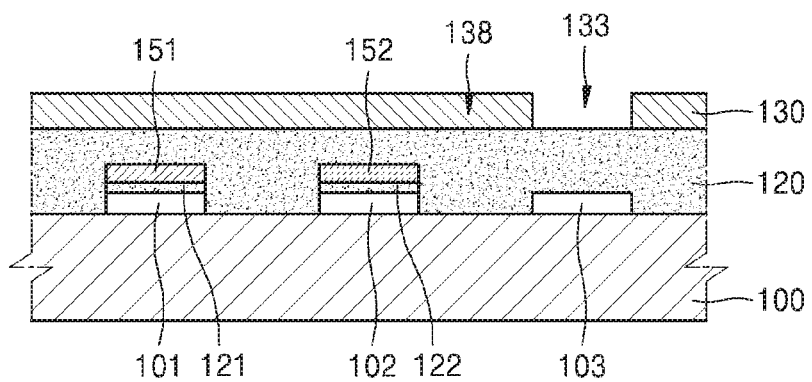

Referring to FIG. 6C, the photoresist 130 has a patterned shape. A third region 133 that is a position corresponding to the third anode 103 is removed from the photoresist 130 that is exposed and developed, and region 138 remains.

Figure 6D:
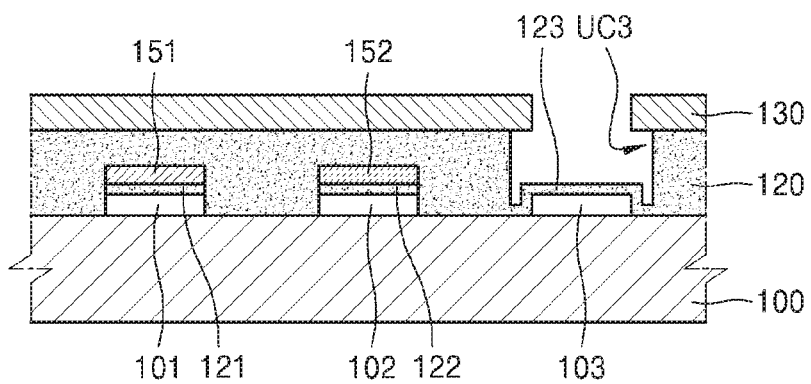

Referring to FIG. 6D, the liftoff layer 120 is etched using a pattern of the photoresist 130 of FIG. 6C.

Because the liftoff layer 120 contains a fluoropolymer, a solvent capable of etching the fluoropolymer may be used as an etchant. A first solvent (not shown) containing fluorine may be used as the etchant. The first solvent may contain hydrofluoroether as in the above-described first unit process and second unit process. The first solvent may use a material different from that used in the first unit process and the second unit process.

The liftoff layer 120 formed at a position corresponding to the third region 133 (see FIG. 6C) of the photoresist 130, that is, above the third anode 103, is etched by the etching process. The liftoff layer 120 on the third anode 103 is not entirely etched, but is etched such that a portion of the liftoff layer 120 remains on the third anode 103, thereby forming the third residual layer 123 of the liftoff layer 120.

The third residual layer 123 of the liftoff layer 120 containing a fluoropolymer is formed between the third anode 103 and the third organic functional layer 153 (see FIG. 6E), which is described below, to function as a surface energy adjustment layer. The third residual layer 123 of the liftoff layer 120 may adjust a charge balance of a device and prevent electrochemical interaction between heterogeneous layers, thereby improving the lifespan and efficiency of the device.

The thickness of the third residual layer 123 of the liftoff layer 120 remaining on the third anode 103 may be equal to or greater than about 0.5 nm and equal to or less than about 5 nm. Because the third residual layer 123 of the liftoff layer 120 is an insulation layer containing a fluoropolymer, if the third residual layer 123 is undesirably thick, resistance increases so that the third residual layer 123 may be difficult to be used for a light-emitting device. If the third residual layer 123 is undesirably thin, it may be difficult for the third residual layer 123 to function as the surface energy adjustment layer.

In order to maintain constant device characteristics, the thickness of the third residual layer 123 of the liftoff layer 120 may be adjusted. Because a method of adjusting a thickness may be performed in the same manner as in the first unit process and the second unit process, a detailed description thereof is omitted.

Also, during the etching of the liftoff layer 120, the first solvent containing fluorine forms a third undercut profile UC3 in the liftoff layer 120 under an interface of the third region 133 (see FIG. 6D) of the photoresist 130.

Figure 6E:
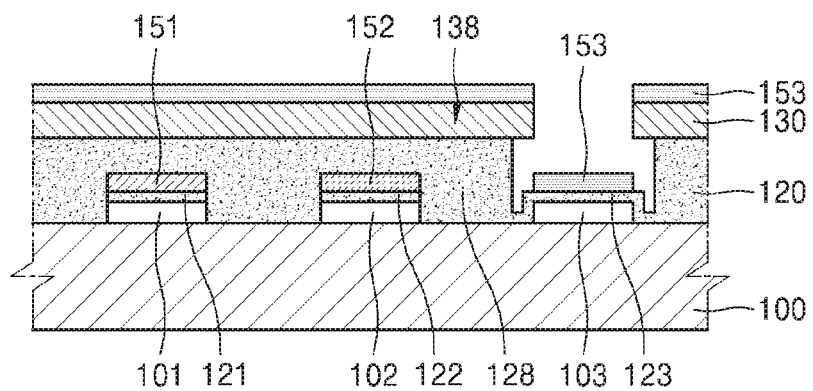

Referring to FIG. 6E, the third organic functional layer 153, including a third organic light-emitting layer, is formed on the structure of FIG. 6D.

The third organic functional layer 153 may further include at least one functional layer of a hole injection layer, a hole transport layer, an electron injection layer, and an electron injection layer.

In the present exemplary embodiment, the third organic light-emitting layer is used as an example of the third organic functional layer 153. Therefore, in the following description, the third organic functional layer and the third organic light-emitting layer may have the same reference numeral.

The third organic light-emitting layer 153 may be formed by a vacuum deposition method. In a deposition process, the liftoff layer 120 and the photoresist 130 function as masks. A portion of the third organic light-emitting layer 153 is formed on the third residual layer 123 of the liftoff layer 120. The other portion of the third organic light-emitting layer 153 is formed on the region 138 where the photoresist 130 remains.

Figure 6F:
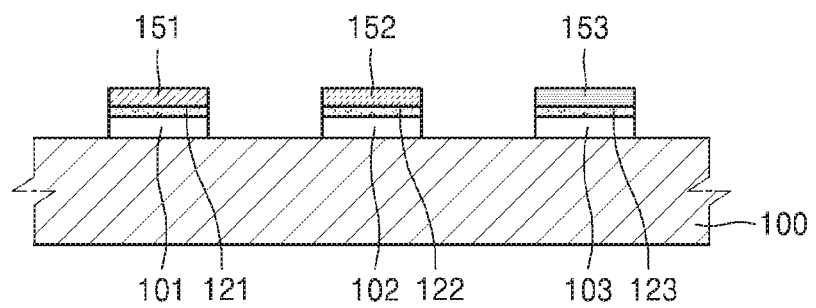

Referring to FIG. 6F, a liftoff process is performed on the structure of FIG. 6E.

Because the liftoff layer 120 contains a fluoropolymer, a second solvent containing fluorine is used in the liftoff process. Also, because the liftoff process is performed after the third organic light-emitting layer 153 is formed, a material having a low reactivity to the third organic light-emitting layer 153 may be used as the second solvent. The second solvent may contain hydrofluoroether, as is contained in the first solvent.

As a liftoff layer 128 formed under the region 138 of FIG. 6E where the photoresist 130 remains is lifted off, the third organic light-emitting layer 153 formed on the region 138 where the photoresist 130 remains is removed, and the third organic light-emitting layer 153 formed on the third residual layer 123 of the liftoff layer 120 is left as a pattern. The third organic light-emitting layer 153 functions as an etch stopper with respect to the third residual layer 123 of the liftoff layer 120.

According to a result of the liftoff process of the third unit process, the third residual layer 123 of the liftoff layer 120 is formed between the third anode 103 and the third organic light-emitting layer 153.

The third residual layer 123 of the liftoff layer 120 containing a fluoropolymer may be formed between the third anode 103 and the third organic light-emitting layer 153 to control surface energy. As the third residual layer 123 of the liftoff layer 120 containing a fluoropolymer forms interfacial dipoles at an interface between the heterogeneous layers such as the third anode 103 and the third organic light-emitting layer 153, an effective work function of the third anode 103 is increased and electrons are confined. Thus, a charge balance is increased so that external quantum efficiency of an organic light-emitting device may be improved.

As the third residual layer 123 of the liftoff layer 120 containing a fluoropolymer having a low reactivity functions as a zipper to reduce electrochemical interaction between the third anode 103 and the third organic light-emitting layer 153, that is, the two heterogeneous layers, the lifespan of the organic light-emitting device may be increased.

Referring back to FIG. 2, after the first to third organic functional layers 151, 152, and 153 are formed in the first to third unit processes, the cathode 180 is formed as a common layer.

Although FIG. 2 illustrates that the cathodes 180 formed on the first to third anodes 101, 102, and 103 are separately formed, the present disclosure is not limited thereto, and the cathodes 180 may be integrally formed.

The first to third organic light-emitting layers 151, 152, and 153 may emit lights of different colors. When mixed together, the lights emitted by the first to third organic light-emitting layers 151, 152, and 153 may form a white light. For example, the first to third organic light-emitting layers 151, 152, and 153 may emit light having the colors of red, green, and blue. For example, the first to third organic light-emitting layers 151, 152, and 153 may configure subpixels forming a unit pixel of the organic light-emitting display apparatus 1.

The organic light-emitting display apparatus 1 of FIG. 2 may represent one unit pixel. Also, the present exemplary embodiment may be applied to an organic light-emitting display apparatus having a plurality of the unit pixels of FIG. 2. In other words, a plurality of the first organic light-emitting layer 151 for emitting a first color in the first unit process may be simultaneously formed. Similarly, a plurality of the second organic light-emitting layer 152 for emitting a second color in the second unit process may be simultaneously formed, and a plurality of the third organic light-emitting layer 153 for emitting a third color in the third unit process may be simultaneously formed. A full color may be presented through the first to third unit processes.

Figure 7:
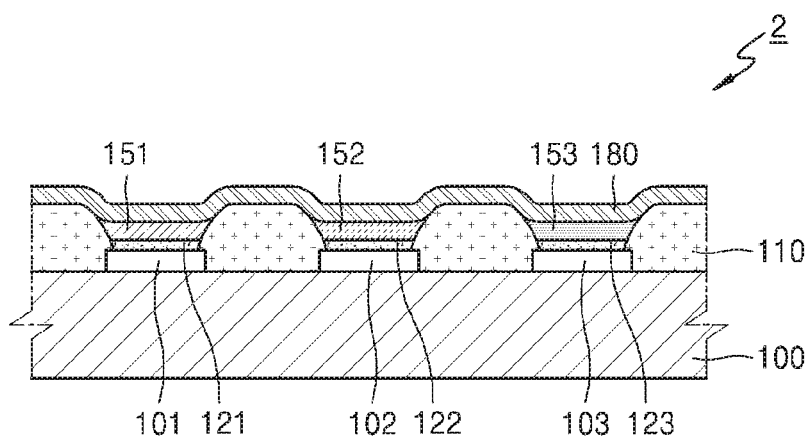
FIG. 7 is a schematic cross-sectional view showing an organic light-emitting display apparatus manufactured by a manufacturing method according to another exemplary embodiment of the present invention.

FIG. 7 is a schematic cross-sectional view of an organic light-emitting display apparatus 2 manufactured by a manufacturing method according to another exemplary embodiment.

The organic light-emitting display apparatus 2 of FIG. 7 may be manufactured similarly to the above-described manufacturing method of the organic light-emitting display apparatus 1 of FIG. 2. In the following description, only the differences from the above-described manufacturing method of the organic light-emitting display apparatus 1 of FIG. 2 are discussed.

Referring to FIG. 7, a plurality of anodes including the first to third anodes 101, 102, and 103 are formed on the substrate 100, and a pixel defining layer 110 surrounding the edge of the first to third anodes 101, 102, and 103 is formed on the substrate 100. The pixel defining layer 110 defines a light-emitting region and prevents a short-circuit of the first to third anodes 101, 102, and 103, and the cathode 180.

In the present exemplary embodiment, the first to third unit processes are performed after forming the first to third anodes 101, 102, and 103, and the pixel defining layer 110.

The first to third residual layers 121, 122, and 123 of the liftoff layer 120 containing a fluoropolymer on the first to third anodes 101, 102, and 103 contacts a surface of the pixel defining layer 110.

The thickness of the first to third residual layers 121, 122, and 123 of the liftoff layer 120 may be equal to or greater than about 0.5 nm and equal to or less than about 5 nm, and the first to third organic light-emitting layers 151, 152, and 153 are respectively formed on the first to third residual layers 121, 122, and 123. After the first to third unit processes are performed, the cathode 180 is formed as a common layer.

Figure 8:
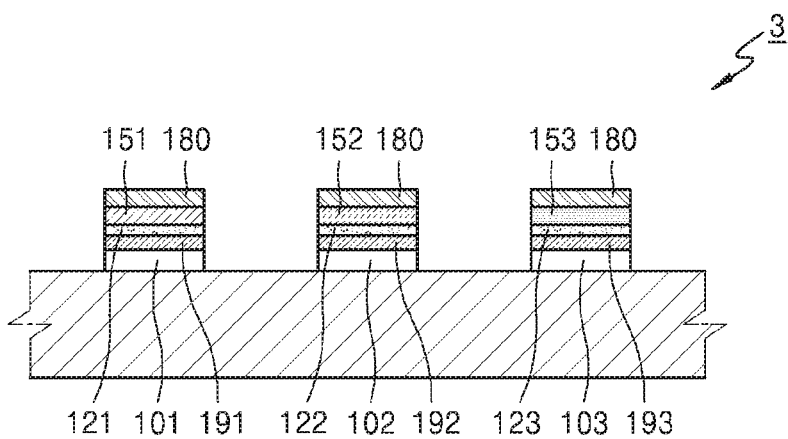
FIG. 8 is a schematic cross-sectional view showing an organic light-emitting display apparatus manufactured by a manufacturing method according to still another exemplary embodiment of the present invention.

FIG. 8 is a schematic cross-sectional view of an organic light-emitting display apparatus 3 manufactured by a manufacturing method according to another exemplary embodiment.

The organic light-emitting display apparatus 3 of FIG. 8 may be manufactured similarly to the above-described manufacturing method of the organic light-emitting display apparatus 1 of FIG. 2. In the following description, only the differences from the above-described manufacturing method of the organic light-emitting display apparatus 1 of FIG. 2 are discussed.

Referring to FIG. 8, a plurality of anodes including the first to third anodes 101, 102, and 103 are formed on the substrate 100. First to third hole transport layers 191, 192, and 193 are further formed on the first to third anodes 101, 102, and 103.

The first to third hole transport layers 191, 192, and 193 may include poly(ethylenedioxythiophene):poly(styrene sulfonic acid) (PEDOT:PSS). Although FIG. 8 illustrates a structure in which the first to third hole transport layers 191, 192, and 193 are all formed, only partial hole transport layers of the first to third hole transport layers 191, 192, and 193 may be formed.

The first to third residual layers 121, 122, and 123 of the liftoff layer 120 containing a fluoropolymer are formed on the first to third hole transport layers 191, 192, and 193. The thickness of the first to third residual layers 121, 122, and 133 of the liftoff layer 120 remaining on the first to third hole transport layers 191, 192, and 193 is equal to or greater than about 0.5 nm and equal or less than about 5 nm. The first to third organic light-emitting layers 151, 152, and 153 are formed on the first to third residual layers 121, 122, and 133. In other words, in the present exemplary embodiment, the liftoff layer 120 directly contacts upper surfaces of the first to third hole transport layers 191, 192, and 193 formed on the first to third anodes 101, 102, and 103. After the first to third unit processes are performed, the cathode 180 is formed as a common layer.

According to the manufacturing method of FIG. 8, the first to third residual layers 121, 122, and 123 of the liftoff layer 120 containing a fluoropolymer is formed between the first to third hole transport layers 191, 192, and 193 and the first to third organic light-emitting layers 151, 152, and 153 to control surface energy. The first to third residual layers 121, 122, and 123 of the liftoff layer 120 containing a fluoropolymer having a low reactivity functions as a zipper to reduce electrochemical interaction between the first to third hole transport layers 191, 192, and 193 and the first to third organic light-emitting layers 151, 152, and 153, that is, the two heterogeneous layers, so as to increase the lifespan of the organic light-emitting device.

Figure 9:
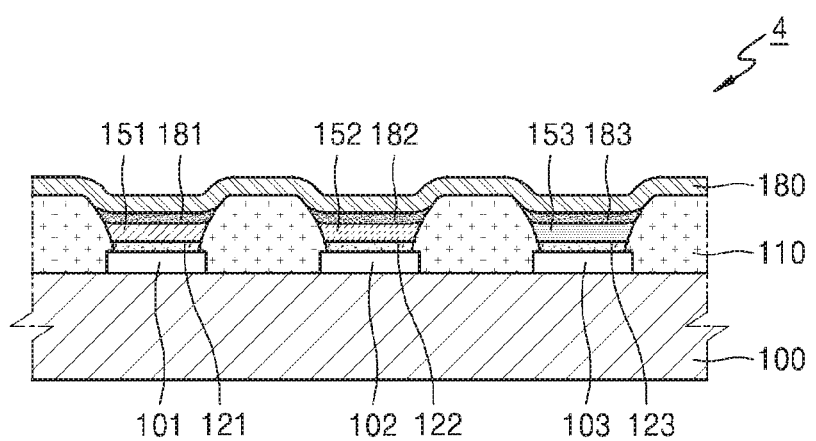
FIG. 9 is a schematic cross-sectional view showing an organic light-emitting display apparatus manufactured by a manufacturing method according to still another exemplary embodiment of the present invention.

FIG. 9 is a schematic cross-sectional view of an organic light-emitting display apparatus 4 manufactured by a manufacturing method according to another exemplary embodiment.

The organic light-emitting display apparatus 4 of FIG. 9 may be manufactured similarly to the above-described manufacturing method of the organic light-emitting display apparatus 2 of FIG. 7. In the following description, only the differences from the above-described manufacturing method of the organic light-emitting display apparatus 2 of FIG. 7 are discussed.

Referring to FIG. 9, a plurality of anodes including the first to third anodes 101, 102, and 103 are formed on the substrate 100. The pixel defining layer 110 surrounding edges of the first to third anodes 101, 102, and 103 is formed on the substrate 100. The pixel defining layer 110 defines a light-emitting region and prevents a short-circuit of the first to third anodes 101, 102, and 103 and the cathode 180.

In the present exemplary embodiment, after the first to third anodes 101, 102, and 103 and the pixel defining layer 110 are formed, the first to third unit processes are performed.

The liftoff layer 120 containing a fluoropolymer (see FIG. 4A) is formed in the first unit process. The first residual layer 121 of the liftoff layer 120 is formed on the first anode 101 by etching the liftoff layer 120 (see FIG. 4E) using a first solvent (not shown) containing fluorine.

The first organic light-emitting layer 151 is formed on the first residual layer 121 of the liftoff layer 120. When the first organic light-emitting layer 151 is formed, a first auxiliary cathode 181 is consecutively deposited on the first organic light-emitting layer 151, and the liftoff process is performed.

During the liftoff process, a second solvent (not shown) containing fluorine is used. The second solvent containing fluorine may damage the first organic light-emitting layer 151. The first auxiliary cathode 181 functions as a barrier with respect to the first organic light-emitting layer 151 during the liftoff process.

After the first unit process, the second unit process is performed. In the second unit process, the liftoff layer 120 containing a fluoropolymer (see FIG. 5A) is formed. The liftoff layer 120 (see FIG. 5E) is etched using a first solvent (not shown) containing fluorine and, thus, the second residual layer 122 of the liftoff layer 120 is formed on the second anode 102.

The second organic light-emitting layer 152 is formed on the second residual layer 122 of the liftoff layer 120. When the second organic light-emitting layer 152 is formed, a second auxiliary cathode 182 is consecutively deposited on the second organic light-emitting layer 152 and the liftoff process is performed.

During the liftoff process, a second solvent (not shown) containing fluorine is used. The second solvent (not shown) containing fluorine may damage the second organic light-emitting layer 152. The second auxiliary cathode 182 may function as a barrier with respect to the second organic light-emitting layer 152 during the liftoff process.

After the second unit process, the third unit process is performed. In the third unit process, the liftoff layer 120 containing a fluoropolymer (see FIG. 6A) is formed. The liftoff layer 120 (see FIG. 6E) is etched using the second solvent containing fluorine and thus the third residual layer 123 of the liftoff layer 120 is formed on the third anode 103.

The third organic light-emitting layer 153 is formed on the third residual layer 123 of the liftoff layer 120. When the third organic light-emitting layer 153 is formed, a third auxiliary cathode 183 is consecutively deposited on the third organic light-emitting layer 153, and the liftoff process is performed.

During the liftoff process, the second solvent containing fluorine is used. The second solvent containing fluorine may damage the third organic light-emitting layer 153. The third auxiliary cathode 183 may function as a barrier with respect to the third organic light-emitting layer 153 during the liftoff process.

After the first to third unit processes are performed, the cathode 180 is formed as a common layer.

According to the manufacturing method of FIG. 9, the first to third auxiliary cathodes 181, 182, and 183 are consecutively deposited on the first to third organic light-emitting layers 151, 152, and 153 during the deposition of the first to third organic light-emitting layers 151, 152, and 153 in each unit process. Accordingly, the first to third auxiliary cathodes 181, 182, and 183 may prevent the first to third organic light-emitting layers 151, 152, and 153 from being damaged in the subsequent liftoff process. Also, because the first to third auxiliary cathodes 181, 182, and 183 electrically contact the cathode 180 that is commonly formed with respect to a plurality of pixels, after the first to third unit processes, a voltage drop of the cathode 180 may be prevented.

Figure 11:
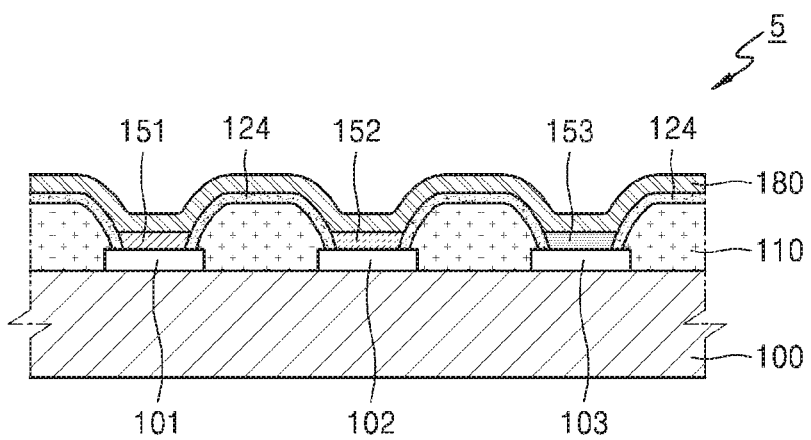
FIG. 11 is a schematic cross-sectional view showing an organic light-emitting display apparatus manufactured by a manufacturing method according to still another exemplary embodiment of the present invention.

FIG. 11 is a schematic cross-sectional view of an organic light-emitting display apparatus 5 manufactured by a manufacturing method according to another exemplary embodiment. FIGS. 12A to 12I are cross-sectional views schematically illustrating the manufacturing method of FIG. 11.

Referring to FIG. 11, the organic light-emitting display apparatus 5 manufactured by the manufacturing method according to the present exemplary embodiment may include a plurality of anodes including the first anode 101, the second anode 102, and the third anode 103 formed on the substrate 100, and the pixel defining layer 110 surrounding edges of the first to third anodes 101, 102, and 103. The pixel defining layer 110 defines a light-emitting region and prevents a short-circuit of the first to third anodes 101, 102, and 103 and the cathode 180.

A fourth residual layer 124 of the liftoff layer 120 containing a fluoropolymer is disposed on the pixel defining layer 110. The first to third organic light-emitting layers 151, 152, and 153 are respectively disposed on the first to third anodes 101, 102, and 103, each of which being formed between the pixel defining layers 110. The cathode 180 that is a common electrode is provided on the first to third organic light-emitting layers 151, 152, and 153.

Because the fourth residual layer 124 of the liftoff layer 120, which coats the pixel defining layer 110, is formed of a liquid repellent material containing a fluorinated copolymer, without forming the pixel defining layer 110 using the liquid repellent material, the first to third organic light-emitting layers 151, 152, and 153 may be formed in an inkjet process, which is described below.

Figure 12A:
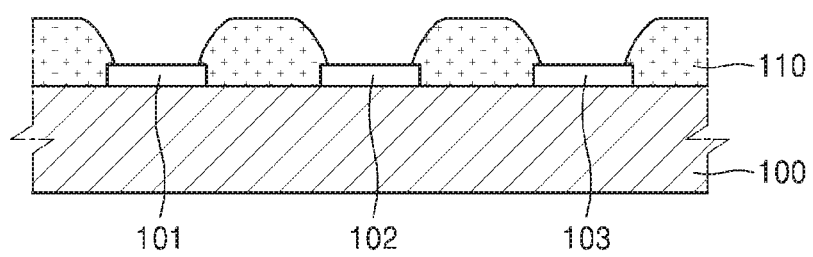
FIG. 12A, FIG. 12B, FIG. 12C, FIG. 12D, FIG. 12E, FIG. 12F, FIG. 12G, FIG. 12H, and FIG. 12I are cross-sectional views schematically showing the manufacturing method of FIG. 11.

Referring to FIG. 12A, a plurality of anodes including the first anode 101, the second anode 102, and the third anode 103 are formed on the substrate 100. The pixel defining layer 110 surrounding edges of the first to third anodes 101, 102, and 103 is formed on the substrate 100.

Figure 12B:
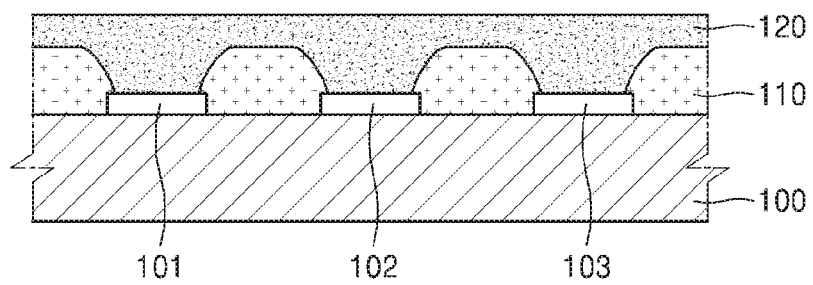

Referring to FIG. 12B, the liftoff layer 120 containing a fluoropolymer is formed on the substrate 100 where the first to third anodes 101, 102, and 103 and the pixel defining layer 110 are formed.

Figure 12C:
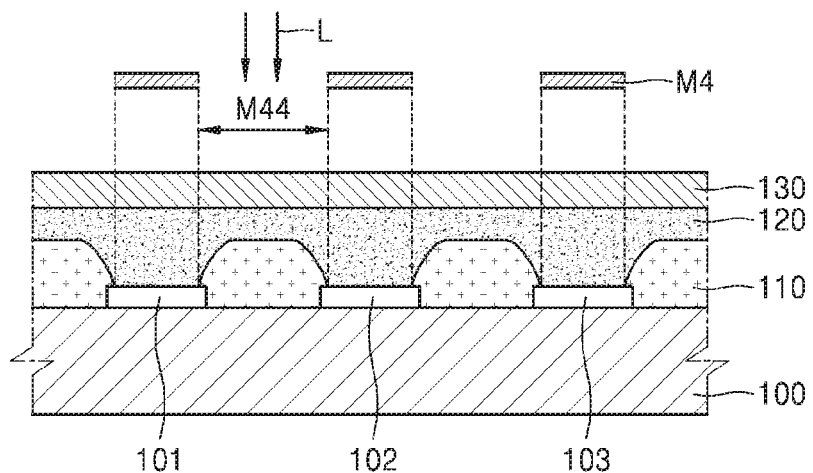

Referring to FIG. 12C, the photoresist 130 is formed on the liftoff layer 120. The photoresist 130 at a position corresponding to the pixel defining layer 110 is exposed to light L through a fourth photomask M4 including a fourth region M44 through which the light L is transmitted. Next, the photoresist 130 that is exposed is developed.

Figure 12D:
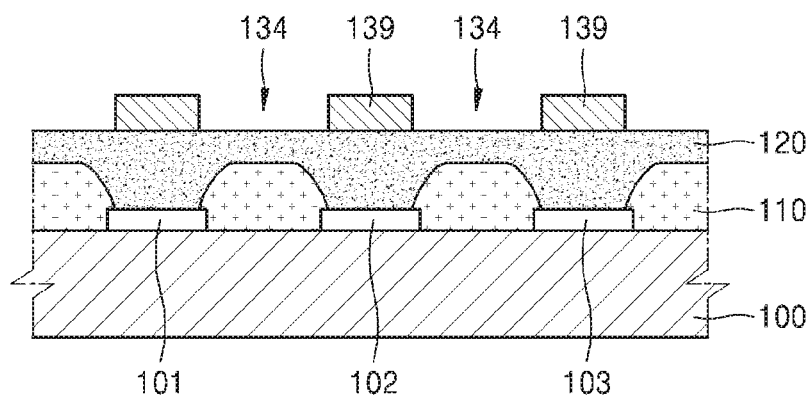

Referring to FIG. 12D, the photoresist 130 has a patterned shape. A fourth region 134 that is a position corresponding to the pixel defining layer 110 is removed from the photoresist 130 that is exposed and developed, and region 139 remains.

Figure 12E:
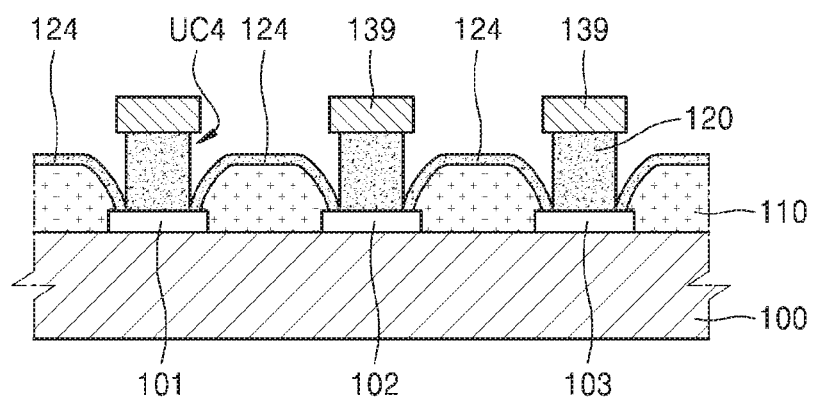

Referring to FIG. 12E, the liftoff layer 120 is etched using the pattern of the photoresist 130 of FIG. 12D.

Because the liftoff layer 120 includes a fluoropolymer, a solvent capable of etching a fluoropolymer may be used as an etchant.

A first solvent (not shown) containing fluorine may be used as the etchant. The first solvent may contain hydrofluoroether.

The liftoff layer 120 formed at a position corresponding to the fourth region 134 (see FIG. 12D) of the photoresist 130, that is, above the pixel defining layer 110, is etched by the etching process. The liftoff layer 120 (see FIG. 12D) on the pixel defining layer 110 is not entirely etched, but is etched such that a portion of the liftoff layer 120 remains on the pixel defining layer 110, thereby forming the fourth residual layer 124 of the liftoff layer 120.

During the etching of the liftoff layer 120, the first solvent containing fluorine forms a fourth undercut profile UC4 in the liftoff layer 120 under an interface of the fourth region 134 (see FIG. 12D) of the photoresist 130.

Figure 12F:
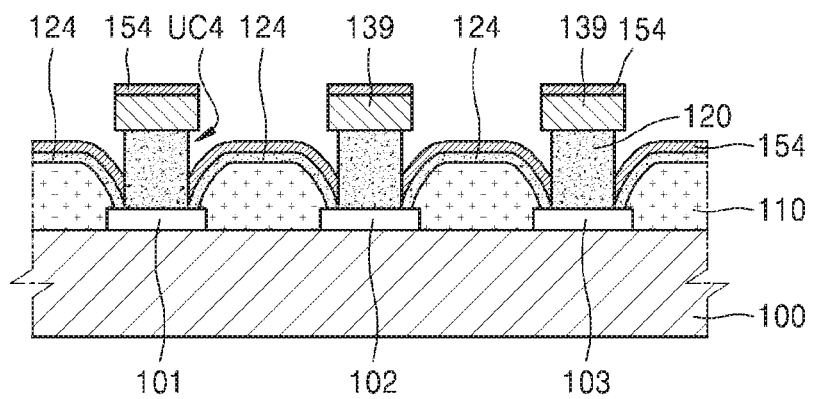

Referring to FIG. 12F, an etch stop layer 154 is formed on the structure of FIG. 12E. The etch stop layer 154 prevents the fourth residual layer 124 of the liftoff layer 120 disposed on the pixel defining layer 110 from being etched in the liftoff process which is described below.

Referring to FIG. 12E, the third organic functional layer 153 including a third organic light-emitting layer is formed on the structure of FIG. 6D.

Figure 12G:
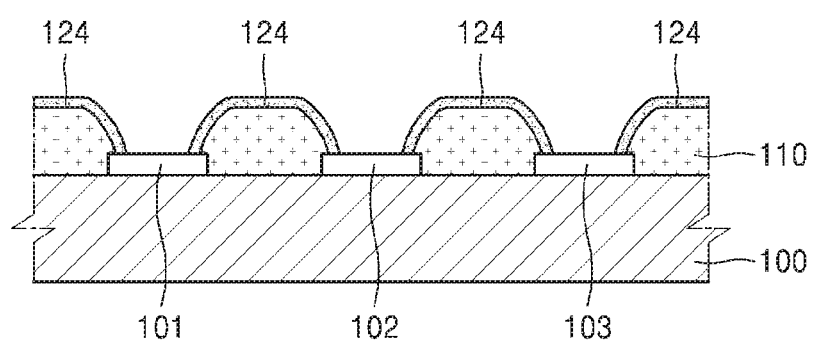

Referring to FIG. 12G, the liftoff process is performed with respect to the structure of FIG. 12F.

Because the liftoff layer 120 contains a fluoropolymer, the second solvent containing fluorine is used in the liftoff process. Because the liftoff process is performed after the etch stop layer 154 is formed, a material having a low reactivity to the etch stop layer 154 may be used as the second solvent. The second solvent may contain hydrofluoroether, as contained in the first solvent.

As the liftoff layer 120 formed under the region 139 (see FIG. 12E) where the photoresist 130 remains is lifted off, the etch stop layer 154 formed on the region 139 where the photoresist 130 remains is removed, and the etch stop layer 154 formed on the fourth residual layer 124 of the liftoff layer 120 is left as a pattern. The etch stop layer 154 functions as an etch stopper with respect to the fourth residual layer 124 of the liftoff layer 120.

After the liftoff process, the etch stop layer 154 formed on the fourth residual layer 124 of the liftoff layer 120 may be removed.

According to a result of the liftoff process, the fourth residual layer 124 of the liftoff layer 120 is formed on the pixel defining layer 110.

Figure 12H:
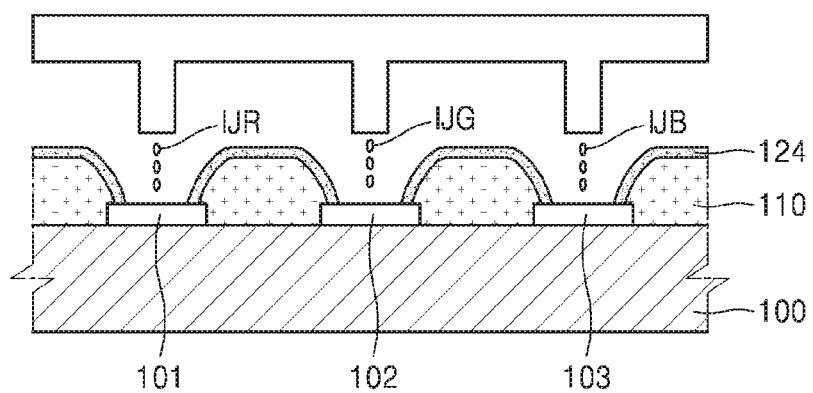

Referring to FIG. 12H, first to third liquid drops IJR, IJG, and IJB, including an organic light-emitting layer, are dropped onto the structure of FIG. 12G in an inkjet process.

Figure 12I:
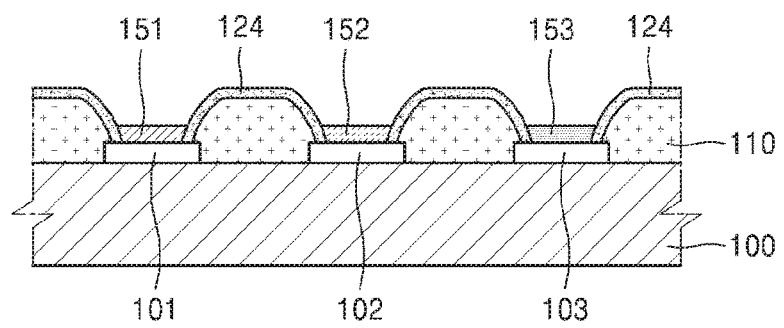

Referring to FIG. 12I, the first to third organic light-emitting layers 151, 152, and 153 are formed on the first to third anodes 101, 102, and 103, respectively.

A manufacturing process using an inkjet process is simpler than one that uses a deposition process and, thus, a manufacturing cost may be reduced. In order to form an organic light-emitting layer by an inkjet process, the pixel defining layer 110 may be formed of a liquid repellent material containing fluorine. The patterning of the pixel defining layer 110 containing fluorine is performed by a photolithography process using photoresist containing fluorine. In this regard, the photoresist is expensive and it is difficult to adjust a content of fluorine needed for the patterning and a content of fluorine needed for the inkjet process.

In the present exemplary embodiment, because the fourth residual layer 124 of the liftoff layer 120 containing a fluoropolymer that is liquid repellent is formed to surround the pixel defining layer 110, without having to form the pixel defining layer 110 as a liquid repellent layer containing fluorine, the pixel defining layer 110 may be easily patterned. Also, each of the first to third organic light-emitting layers 151, 152, and 153 may be easily formed between the pixel defining layers 110 by the inkjet process.

Figure 13:
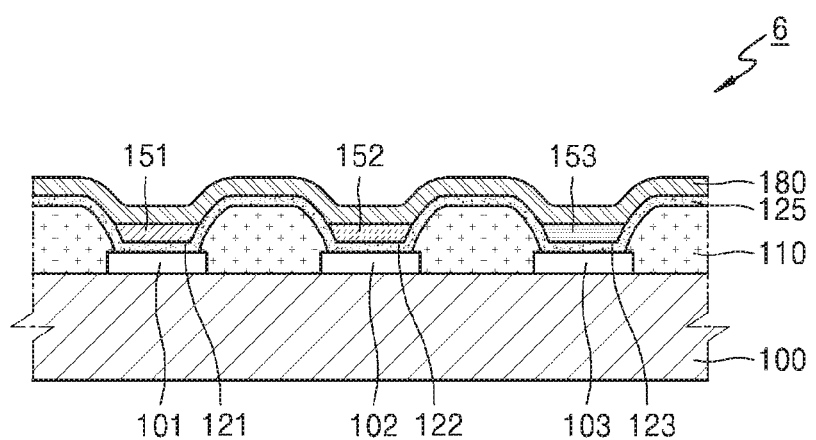
FIG. 13 is a schematic cross-sectional view showing an organic light-emitting display apparatus manufactured by a manufacturing method according to still another exemplary embodiment of the present invention.

FIG. 13 is a schematic cross-sectional view of an organic light-emitting display apparatus 6 manufactured by a manufacturing method according to an exemplary embodiment.

Referring to FIG. 13, the organic light-emitting display apparatus 6 manufactured by the manufacturing method according to the present exemplary embodiment may include a plurality of anodes including the first anode 101, the second anode 102, and the third anode 103, on the substrate 100. The pixel defining layer 110 is formed surrounding edges of the first to third anodes 101, 102, and 103. The pixel defining layer 110 defines a light-emitting region to prevent a short-circuit between the first to third anodes 101, 102, and 103 and the cathode 180.

A fifth residual layer 125 of the liftoff layer 120 containing a fluoropolymer is disposed on the first to third anodes 101, 102, and 103 and the pixel defining layer 110. The first to third organic light-emitting layers 151, 152, and 153 are respectively disposed on the first to third anodes 101, 102, and 103, each of which is formed between the pixel defining layers 110. The cathode 180 that is a common electrode is provided on the first to third organic light-emitting layers 151, 152, and 153.

Because the fifth residual layer 125 of the liftoff layer 120 containing a fluoropolymer that coats the pixel defining layer 110 is liquid repellent, the first to third organic light-emitting layers 151, 152, and 153 may be formed by an inkjet process without coating the pixel defining layer 110 with a liquid repellent material.

As the fifth residual layer 125 of the liftoff layer 120 containing a fluoropolymer forms interfacial dipoles at an interface between the heterogeneous layers such as the first to third anodes 101, 102, and 103 and the first to third organic light-emitting layers 151, 152, and 153, an effective work function of each of the first to third anodes 101, 102, and 103 is increased, and electrons are confined. Thus, a charge balance is increased so that external quantum efficiency of an organic light-emitting device may be improved. Furthermore, although not illustrated in the above-described drawings, the above-described organic light-emitting display apparatuses 1, 2, 3, 4, 5, 6, and 7 may further include an encapsulation member that encapsulates the organic light-emitting layers 151, 152, and 153. The encapsulation member may be formed of a glass substrate, metal foil, or a thin film encapsulation layer mixed of an inorganic layer and an organic layer.

According to the above-described example embodiments, the manufacturing process of an organic light-emitting display apparatus is simplified and the pattern misalignment problem may be prevented. Also, the efficiency of an organic light-emitting display apparatus may be improved, and the lifespan of an organic light-emitting apparatus may be extended.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display apparatus, comprising:
   a first electrode disposed on the substrate;
   a pixel defining layer covering an edge of the first electrode;
   a residual layer disposed on the first electrode and the pixel defining layer, the residual layer comprising a fluoropolymer;
   a first organic functional layer comprising a first light emitting layer disposed on the residual layer on the first electrode; and
   a second electrode disposed on the first organic functional layer.

2. The organic light-emitting display apparatus of claim 1, wherein the fluoropolymer has a fluorine content in a range of about 20~60 wt %.

3. The organic light-emitting display apparatus of claim 1, wherein the fluoropolymer comprises at least one of polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

4. The organic light-emitting display apparatus of claim 1, wherein a thickness of the residual layer is equal to or greater than about 0.5 nm and equal to or less than about 5 nm.

5. The organic light-emitting display apparatus of claim 1, wherein the organic functional layer comprises at least one functional layer of a hole injection layer, a hole transport layer, an electro transport layer, and an electron injection layer.

6. An organic light-emitting display apparatus, comprising:
   a first first electrode disposed on the substrate;
   a second first electrode disposed separate from the first first electrode;
   a pixel defining layer covering an edge of the first first electrode and the second first electrode;
   a residual layer disposed on the first first electrode, the second first electrode and the pixel defining layer, the residual layer comprising a fluoropolymer;
   a first organic functional layer comprising a first light emitting layer disposed on the residual layer on the first first electrode;
   a second organic functional layer comprising a second light emitting layer disposed on the residual layer on the second first electrode; and
   a second electrode commonly disposed on the first organic functional layer and second organic functional layer.

7. The organic light-emitting display apparatus of claim 6, wherein a first color of light emitted from the first light emitting layer is different from a second color of light emitted from the second light emitting layer.

8. The organic light-emitting display apparatus of claim 6, further comprising;
   a first auxiliary cathode disposed between the first organic functional layer and the second electrode; and
   a second auxiliary cathode disposed between the second organic functional layer and the second electrode.

9. The organic light-emitting display apparatus of claim 8, wherein the first auxiliary cathode and the second auxiliary cathode directly contact the second electrode.

10. The organic light-emitting display apparatus of claim 6, wherein the second electrode is integrally disposed on the first organic functional layer and second organic functional layer.

* * * * *